Figure 1:
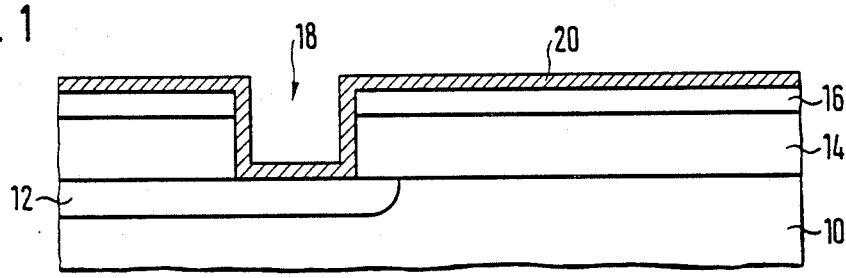

United States Patent [19]

Naumann et al.

[11] Patent Number: 4,882,293

[45] Date of Patent: Nov. 21, 1989

[54] METHOD OF MAKING AN ELECTRICALLY PROGRAMMABLE INTEGRATED CIRCUIT CONTAINING MELTABLE CONTACT BRIDGES

[75] Inventors: Jorg Naumann, Weinheim; Thomas Sharnagl, Freising; Leo Stroth, Wolfersdorf, all of Fed. Rep. of Germany

[73] Assignee: Texas Instruments Deutschland GmbH, Dallas, Tex.

[21] Appl. No.: 312,358

[22] Filed: Feb. 15, 1989

Related U.S. Application Data

[63] Continuation of Ser. No. 244,962, Sep. 15, 1988, abandoned.

[30] Foreign Application Priority Data

Sep. 19, 1987 [DE] Fed. Rep. of Germany ....... 3731621

[51] Int. Cl.[4] .................. H01L 21/283; H01L 21/308
[52] U.S. Cl. ..................................... 437/52; 437/190; 437/192; 437/194; 437/922
[58] Field of Search ................... 437/48, 52, 190, 192, 437/194, 922; 156/643, 664, 665

[56] References Cited

U.S. PATENT DOCUMENTS

| | | | |
|---|---|---|---|
| 4,209,894 | 7/1980 | Keen | 437/921 |
| 4,233,671 | 11/1980 | Gerzberg et al. | 365/105 |
| 4,238,839 | 12/1980 | Redfern et al. | 365/96 |
| 4,289,574 | 9/1981 | Radigan et al. | 156/643 |
| 4,382,289 | 5/1983 | Saitoh | 365/96 |
| 4,536,948 | 8/1985 | Te Velde et al. | 437/922 |
| 4,536,949 | 8/1985 | Takayama et al. | 437/922 |
| 4,569,124 | 2/1986 | Rensch et al. | 156/628 |
| 4,740,485 | 4/1988 | Sharpe-Geisler | 437/246 |

FOREIGN PATENT DOCUMENTS

| | | |
|---|---|---|
| 0146688 | 7/1985 | European Pat. Off. . |
| 3617141 | 11/1986 | Fed. Rep. of Germany . |
| 58-16340 | 3/1983 | Japan ................... 437/922 |

Primary Examiner—Olik Chaudhuri
Attorney, Agent, or Firm—William E. Hiller; N. Rhys Merrett; Melvin Sharp

[57] ABSTRACT

A method is described of making an electrically programmable integrated circuit which comprises meltable contact bridges (22) between selected connecting points. In the method, firstly in a semiconductor substrate (10) by means of diffusion or ion implantation to obtain desired circuit functions a semiconductor structure with zones (12) of different conductivity type is formed. On the surface of the semiconductor structure a first protective layer (14) is formed in which contact windows (18) to the selected connecting points are then formed. On the surface of the first protective layer (14) and in the contact windoews (18) a through conductive layer (20) is made of a material forming the fusible contact bridges (22). Using a plasma etching method the conductive layer (20) is etched away so that only the contact bridges (22) with an associated connecting end (21) and conductor regions leading from the contact bridges (22) to the connecting points in the contact windows (18) remain. On the remaining conductor regions a second protective layer (24) is formed which is then etched away by means of a plasma etching method except for the regions lying over the contact bridges (22). In the region of the contact windows (18) and on the connecting ends (21) of the contact bridges (22) a connecting metallization (26, 28) is then applied.

10 Claims, 1 Drawing Sheet

METHOD OF MAKING AN ELECTRICALLY PROGRAMMABLE INTEGRATED CIRCUIT CONTAINING MELTABLE CONTACT BRIDGES

This application is a Continuation, of application Ser. No. 244,962, filed Sept. 15, 1988, now abandoned.

The invention relates to a method of making an electrically programmable integrated circuit comprising meltable contact bridges between selected connecting points wherein firstly in a semiconductor substrate by means of diffusion or ion implanatation to obtain desired circuit functions a semiconductor structure with zones of different conductivity type is formed.

Known electrically programmable integrated circuits, for example so-called PLAs, contain after their fabrication and before their practical use contact bridges which are located between selected circuit points and which by applying electrical signals to predetermined circuit inputs can be melted through or fused. In a special programming cycle in such circuits the contact bridge can be retained between selected circuit points whilst it can be interrupted between other contact points and this then gives the desired circuit function.

In the production of such programmable integrated circuits, in the past to form the contact bridges wet etching methods were employed which have the known disadvantage that it is not possible to go below specific geometrical dimensions of the structures remaining after the etching.

The invention is based on the problem of providing a method of the type outlined at the beginning which makes it possible in the fabrication electrically programmable integrated circuits to obtain smaller dimensions of the individual structures with high reliability.

This problem is solved according to the invention in that on the surface of the semiconductor structure a first protective layer is formed, that in the first protective layer contact windows to the selected connecting points are formed, that on the surface of the first protective layer and in the contact windows a continuous conductive layer of a material forming the meltable contact bridges is formed, that by using a plasma etching method the conductive layer is etched away so that only the contact bridges with an associated connecting end and conductor regions leading from the contact bridges to the connecting points in the contact windows are left remaining, that on the remaining conductor regions a second protective layer is applied which is then etched away by means of a plasma etching method except for the regions lying over the contact bridges, and that in the region of the contact windows and on the connecting ends of the contact bridges a connecting metallization is applied.

The method according to the invention is so designed that wet etching steps are no longer necessary at all, the removal of the layers to be removed being carried out solely using plasma etching which permits fabrication of substantially smaller structures. Employing plasma etching also utilizes the advantage that in this etching method no appreciable under-etching occurs, which frequently leads to problems when using wet etching methods and has a disadvantageous effect on the exactness of the structures to be made.

Figure 2:
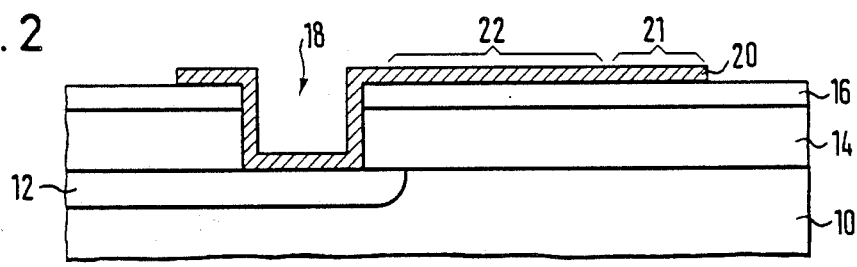
Figure 3:
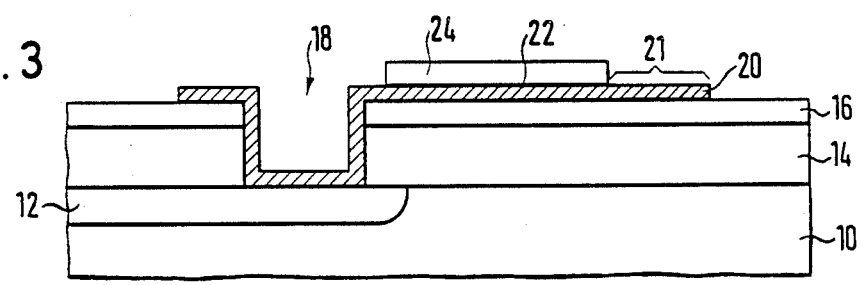
Figure 4:
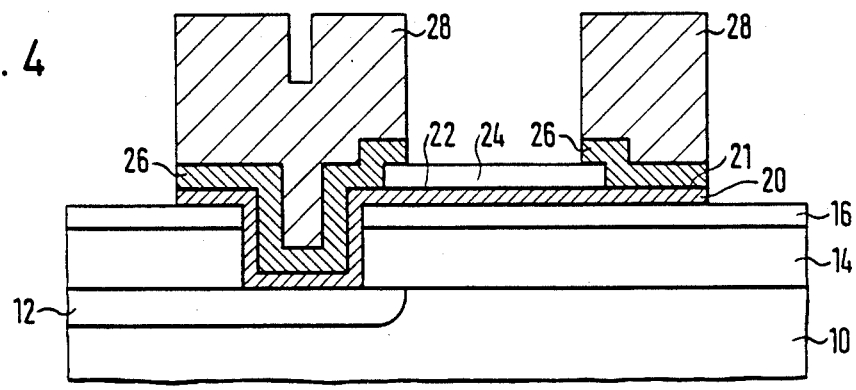

The invention will now be explained by way of example with the aid of the drawings, wherein:

FIG. 1 shows a schematic sectional view of part of an electrically programmable integrated circuit in the course of its production method after application of the conductive layer used to form a meltable contact bridge, FIG. 2 is a section corresponding to FIG. 1 after a plasma etching step for defining the meltable contact bridge, FIG. 3 is a further sectional view corresponding to FIG. 1 or 2 after application of a protective layer to the meltable contact bridge and FIG. 4 is a further sectional view of the portion of the integrated circuit after formation of the contact connections to the meltable contact bridge following a further plasma etching step.

The drawing show only a small part of a semiconductor substrate 10 in which by using conventional method steps such as diffusion or ion implantation a semiconductor structure with zones of different conductivity type has been formed. The small portion of the semiconductor substrate 10 illustrated in the drawings contains one such zone 12.

After the formation of the semiconductor structure in the semiconductor substrate 10 the surface is coated with a layer 14 of silicon dioxide which inter alia serves as protective layer for the semiconductor structure. Applied to the layer 14 is a further protective layer 16, this being done by deposition from the gaseous phase. Thereafter, a contact window 18 is opened through the two layers 14 and 16, said window making the zone 12 disposed in the semiconductor substrate 10 accessible. The contact window is made by conventional masking and etching methods with which the expert is familiar and which need not be explained in detail here.

Hereafter, a conductive layer 20 of titanium-tungsten is applied to the protective layer 16 and in the contact window 18 and it is from this layer that the contact bridge which can be melted through is finally to be made. FIG. 1 shows the integrated circuit in the state after application of the conductive layer 20.

The conductive layer 20 is now coated with an etching protective mask which by exposure and removal is brought to a form such that the etching protective layer remains only on the region 22 of the conductive layer 20 forming the meltable contact bridge and an associated connecting end 21 and in the region extending over the contact window 18. The exposed regions of the conductive layer 20 are now completely removed by a plasma etching method in which the device to be treated is bombarded with ions and as a result only the portion of the conductive layer 20 visible in FIG. 2 remains. In this plasma etching method the protective layer 16 prevents the layer 14 therebelow from being attacked.

After carrying out the plasma etching method a further etching protective layer 24 is applied to the surface of the structure shown in FIG. 2 and said layer 24 is patterned by selective exposure and removal in the manner described in connection with FIG. 2 so that the protective layer 24 is left only above the region 22 of the conductive layer 20 forming the actual contact bridge. This stage of the production method is shown in FIG. 3.

The region 22 of the conductive layer 20 forming the fusible contact bridge must now be provided with contact terminals so that the current leading as required to a melting of the contact bridge can br supplied to said bridge. The connecting contacts are made in the form of a contact metallization on the region 21 of the conductive layer 20 and in the region of the contact window 18. Via the contact window 18 the connecting metallization also establishes an electrical connection to the zone 12 disposed in the semiconductor substrate.

The contact metallization is preferably made up of two metal layers, that is a first metal layer 26 of titaniumtungsten and a second metal layer 28 of aluminium disposed thereabove. For applying the contact metallization the structure of FIG. 3 is firstly coated with the metal layer 26 and then with the metal layer 28. Using a further plasma etching step the contact metallizations are then made in the form illustrated in FIG. 4. This means that the metal layers 26 and 28 are removed by reactive ion etching at all locations where they are not required so that contact metallizations remain only over the region 21 and over the contact window 18. In this plasma etching step the protective layer 24 protects the region 22 of the contact bridge therebelow from the ions removing the metal layers 26 and 28.

The purpose of the metal layer 26 of titanium-tungsten is to prevent reactions between the aluminium material of the layer 28 and the structure therebelow.

The plasma etching step employed to form the contact metallizations results in removal of the layer 28 and the layer 26 such that the remaining portions of these two layers are exactly aligned with each other, as apparent from FIG. 4. This alignment results as it were automatically and the consequence thereof is an exact definition of the geometrical dimensions of the contact bridge. The use of plasma etching further makes it possible to obtain substantially smaller dimensions than would be possible when employing wet etching methods.

Thus, with the method described electrically programmable integrated circuits with meltable contact bridges can be made employing the advantageous plasma etching method.

We claim:

1. A method of making an electrically programmable integrated circuit comprising:
   providing a substrate of semiconductor material having at least one circuit-function defining zone provided with electrical conductivity and opening onto the top surface thereof;
   forming a first protective layer resistant to plasma etching on said semiconductor substrate and covering the top surface thereof;
   selectively patterning said first protective layer resistant to plasma etching to form an aperture extending therethrough to at least a portion of said at least one zone exposing a contact area of said at least one zone of said semiconductor substrate;
   depositing conductive material on said first protective layer and the exposed contact area of said at least one zone to provide a conductive layer on said first protective layer and said contact area of said at least one zone in overlying relation thereto;
   Forming a first etching-protective mask on said conductive layer covering only the portions of said conductive layer from which a contact bridge and an associated connecting end are to be formed and the portion of said conductive layer overlying said contact area of said at least one zone;
   performing a first plasma etching procedure to selectively remove the exposed portions of said conductive layer, thereby defining a patterned conductive layer having a contact bridge and an associated connecting end formed thereon and including a portion overlying said contact area of said at least one zone;
   forming a second etching-protective mask on the patterned conductive layer covering only the region of said patterned conductive layer forming the contact bridge;
   depositing metallic material on the structure including the second etching-protective mask and the exposed portions of the patterned conductive layer to provide at least one metallic layer thereover; and
   performing a second plasma etching procedure to selectively remove portions of said metallic layer on said patterned conductive layer while retaining portions of said metallic layer overlying said contact area of said at least one zone and the portion of said patterned conductive layer defining the connecting end associated with the contact bridge to provide a patterned metallic layer forming electrical contact members;
   The second etching-protective mask shielding the region of said patterned conductive layer forming the contact bridge from etching during the second plasma etching procedure.

2. A method as set forth in claim 1, wherein the deposition of metallic material on the structure including said second etching-protective mask and the exposed portions of the patterned conductive layer comprises:
   depositing a first metallic material on said second etching-protective mask and the exposed portions of the patterned conductive layer to provide a first metallic layer thereover;
   depositing a second metallic material different from the first metallic material on said first metallic layer to provide a second metallic layer; and
   then performing said second plasma etching procedure to simultaneously selectively remove portions of said first and second metallic layers on said patterned conductive layer, while retaining portions of said first and second metallic layers overlying said contact area of said at least one zone and the portion of said patterned conductive layer defining the connecting end associated with the contact bridge to provide a patterned composite metallic layer as the electrical contact members.

3. A method as set forth in claim 1, wherein the first metallic material deposited on said second etching-protective mask and the exposed portions of the patterned conductive layer is a conductive reaction-resistant material to provide said first metallic layer as a reaction barrier layer, and the second metallic material deposited on said first metallic layer in providing said second metallic layer is a conductive material to provide said second metallic layer from which the patterned composite metallic layer is formed as the electrical contact members;
   said first patterned metallic layer serving as a reaction barrier layer between said second patterned metallic layer and the structure therebelow.

4. a method as set forth in claim 3, wherein the first metallic material deposited in providing said first metallic layer is a titanium-tungsten alloy, and the second metallic material deposited in providing said second metallic layer is aluminum.

5. A method as set forth in claim 1, wherein the conductive material deposited on said first protective layer and the exposed contact area of said at least one zone is a titanium-tungsten alloy, and the patterned conductive layer as formed therefrom forms a meltable contact bridge and an associated connecting end.

6. A method as set forth in claim 1, further including:

forming an insulation layer on said semiconductor substrate covering the top surface thereof prior to the formation of said first protective layer on said semiconductor substrate;

thereafter forming said first protective layer overlying said insulation layer on said semiconductor substrate; and selectively patterning said first protective layer and said insulation layer simultaneously in forming the aperture extending through said first protective layer and said insulation layer to said at least a portion of said at least one zone exposing the contact area of said at least one zone of said semiconductor substrate.

7. A method as set forth in claim 5, wherein the deposition of metallic material on the structure including said second etching-protective mask and the exposed portions of the patterned conductive layer comprises:

depositing a first metallic material on said second etching-protective mask and the exposed portions of the patterned conductive layer to provide a first metallic layer thereover;

depositing a second metallic material different from the first metallic material on said first metallic layer to provide a second metallic layer; and then performing said second plasma etching procedure to simultaneously selectively remove portions of said first and second metallic layers on said patterned conductive layer, while retaining portions of said first and second metallic layers overlying said contact area of said at least one zone and the portion of said patterned conductive layer defining the connecting end associated with the contact bridge to provide a patterned composite metallic layer as the electrical contact members.

8. A method as set forth in claim 7, wherein the first metallic material deposited on said second etching-protective mask and the exposed portions of the patterned conductive layer is a conductive reaction-resistant material to provide said first metallic layer as a reaction barrier layer, and the second metallic material deposited on said first metallic layer in providing said second metallic layer is a conductive material to provide said second metallic layer from which the patterned composit metallic layer is formed as the electrical contact members;

said first patterned metallic layer serving as a reaction barrier layer between said second patterned metallic layer and the structure therebelow.

9. A method as set for the in claim 8, wherein the first metallic material deposited in providing said first metallic layer is a titanium-tungsten alloy, and the second metallic material deposited in providing said second metallic layer is aluminum.

10. A method as set forth in claim 5, further including:

forming an insulation layer on said semiconductor substrate covering the top surface thereof prior to the formation of said first protective layer on said semiconductor substrate;

thereafter forming said first protective layer overlying said insulation layer on said semiconductor substrate; and selectively patterning said first protective layer and said insulation layer simultaneously in forming the aperture extending through said first protective layer and said insulation layer to said at least a portion of said at least one zone exposing the contact area of said at least one zone of said semiconductor substrate.

* * * * *